US006231983B1

(12) United States Patent
Lee et al.

(10) Patent No.: US 6,231,983 B1
(45) Date of Patent: May 15, 2001

(54) METHOD OF ORIENTING MOLECULAR ELECTRONIC COMPONENTS

(75) Inventors: Ida Lee, Knoxville; James W. Lee; Elias Greenbaum, both of Oak Ridge, all of TN (US)

(73) Assignee: UT-Battelle, Oak Ridge, TN (US)

( * ) Notice: Subject to any disclaimer, the term of this patent is extended or adjusted under 35 U.S.C. 154(b) by 0 days.

(21) Appl. No.: 09/181,047

(22) Filed: Oct. 27, 1998

(51) Int. Cl.[7] ............................ B32B 15/04; B32B 18/00; B32B 31/00; H01L 51/00
(52) U.S. Cl. ...................... 428/411.1; 428/446; 428/457; 428/910; 257/40; 257/642
(58) Field of Search ................................ 428/411.1, 446, 428/457, 910; 257/40, 642

(56) References Cited

U.S. PATENT DOCUMENTS 4,399,044 * 8/1983 Buckley et al. ........................ 204/15
5,585,646 * 12/1996 Kossovsky et al. .................... 257/40

OTHER PUBLICATIONS

Lee, Ida et al., "Biomolecular Electronics: Vectorial Arrays of Photosynthetic Reaction Centers," *Physical Review Letters*, vol. 79, No. 17, pp. 3294–3297 (Oct. 27, 1997).

Reeves, S.G. et al., "Higher Plant Chloroplasts and Grana: General Preparative Procedures (Excluding High Carbon Dioxide Fixation Ability Chloroplasts)," *Methods in Enzymology*, vol. 69, pp. 85–94 (1980).

Hill, R. et al., "Function of the Two Cytchrome Components in Chloroplasts: A Working Hypothesis," *Nature*, vol. 186, pp. 136–137 (Apr. 9, 1960).

* cited by examiner

*Primary Examiner*—Paul Thibodeau
*Assistant Examiner*—Ramsey Zacharia
(74) *Attorney, Agent, or Firm*—Kilpatric Stockton LLP

(57) ABSTRACT

Molecular devices using functional Photosystem I reaction centers are prepared on flat derivatized substrate surfaces. The nature and extent of orientation are controlled by chemical modification of the surface derivative. The surface of the substrate is chemically modified such that the Photosystem I reaction centers may be immobilized in a desired orientation. Preferably, a sulfur-organic compound is used to chemically modify the surface of the substrate. Depending on the type of chemical modification, the orientation of the reaction centers may be parallel to the surface, perpendicular to the surface in the "up" position, or perpendicular to the surface in the "down" position. The different orientations provide different electrical characteristics to the device.

18 Claims, 1 Drawing Sheet

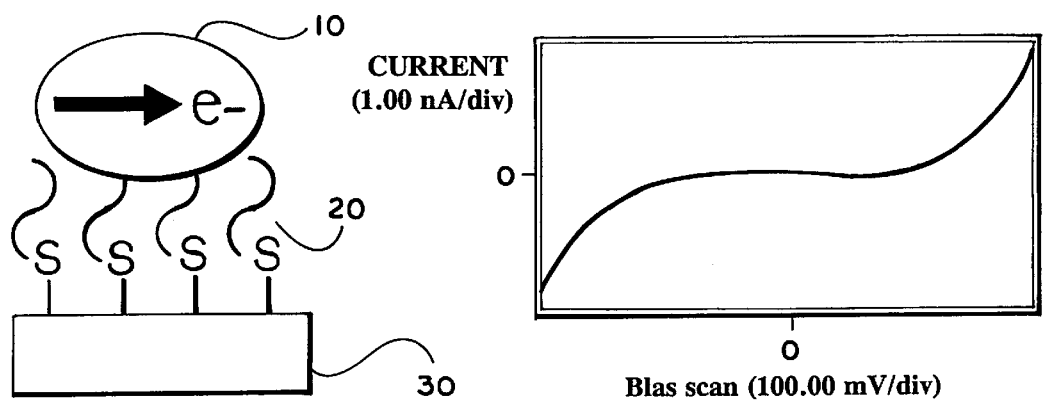
 
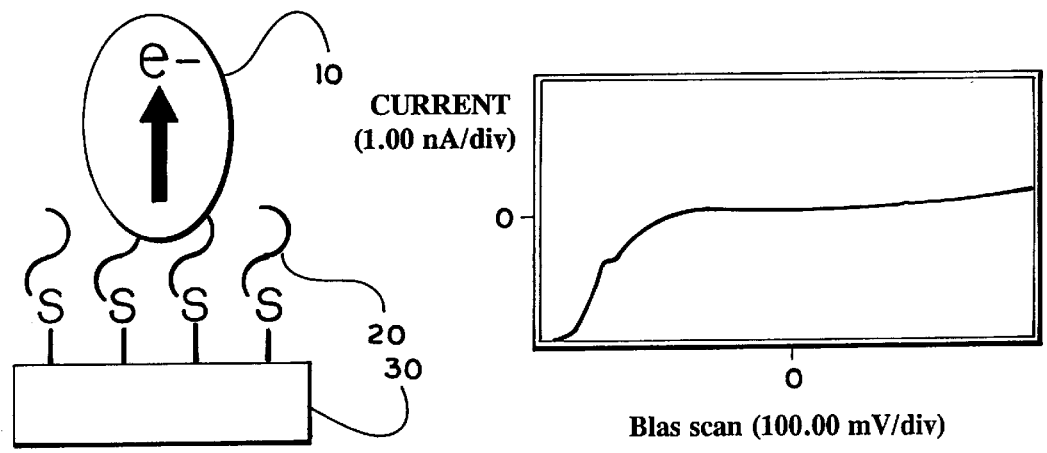
 
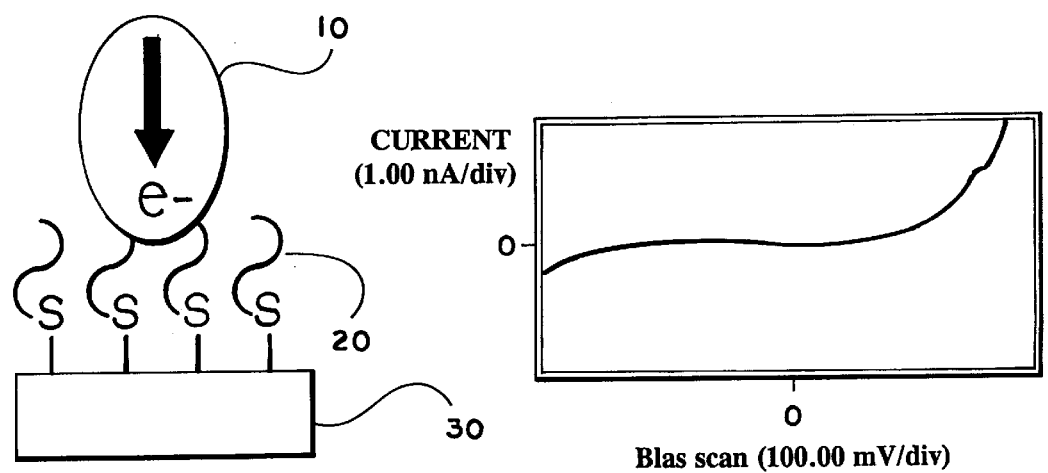
 

METHOD OF ORIENTING MOLECULAR ELECTRONIC COMPONENTS

FIELD OF THE INVENTION

The present invention relates, in general, to methods of forming molecular devices capable of converting light energy into chemical energy. More specifically, the present invention is directed to methods of chemically modifying the surface of a substrate such that Photosystem I reaction centers may be oriented in a preselected orientation.

BACKGROUND OF THE INVENTION

Green plants and photosynthetic bacteria capture and utilize sunlight by means of molecular electronic complexes, reaction centers, that are embedded in their membranes. In oxygenic plants, photon capture and conversion of light energy into chemical energy take place in pigment-protein complexes known as Photosystem I ("PSI") and Photosystem II ("PSII") reaction centers. As explained in *Nature*, R. Hill and F. Bendall (London) 186, 136 (1960), photosynthesis requires PSII and PSI working in sequence, using water as the source of electrons and $CO_2$ as the terminal electron acceptor. The two reaction centers use a special pair of chlorophyll molecules as the primary electron donor and chlorophyll or pheophytin as the primary electron acceptor. Following excitation, transfer of an electron from the excited primary donor to the primary acceptor occurs within picoseconds, a process characterized by high quantum efficiency and minimal side reactions. For the PSI reaction center, the midpoint oxidization potential generated by the primary electron donor (P700) is about +0.4 V and the corresponding reduction potential generated by the electron acceptor (4Fe-4S center) is about −0.7 V. The PSI reaction center, therefore, is a photodiode (unidirectional electron flow) and nanometer-sized (~6 nm) solar battery.

Additionally, since the PSI reaction center is one of the pigment-protein complexes that is responsible for the photosynthetic conversion of light energy to chemical energy, these reaction centers may be used as an electronic component in a variety of different devices. These possible devices include, but are not limited to, spatial imaging devices, solar batteries, optical computing and logic gates, optoelectronic switches, photonic A/D converters, and thin film "flexible" photovoltaic structures. However, in order to make these PSI reaction centers into a molecular device it is very important to use a method to selectively immobilize the PSI reaction centers onto a substrate without denaturation of the PSI.

The prior art has attempted to replicate this photochemical reaction by using PSI reaction centers on a metal surface. The prior art has shown that platinum may be precipitated on the surface of photosynthetic membranes, thereby making direct electrical contact with the acceptor side of PSI, where it can either catalyze hydrogen evolution or drive photocurrent through an external circuit. Additionally, the prior art has recently shown that isolated PSI reaction centers can be platinized without altering their intrinsic excitation dynamics and initial electron transfer reactions. Additionally, the prior art has shown that a two-dimensional spatial array of isolated PSIs may be anchored onto a metal surface by PSI-platinum-gold bonding at a biological temperature and pH. However, these prior art methods were not capable of orienting the PSI reaction centers on the surface of the substrate. PSI reaction centers which are not oriented will cancel each other out, which, therefore, would not permit the PSI-immobilized devices to be used in photoelectric devices such as solar batteries or logic gates.

The present invention provides a solution to the orientation problem. The present invention provides a method for controlling the orientation of two-dimensional spatial arrays of isolated reaction centers on derivatized surfaces. By controlling the orientation of the reaction centers, these arrays may be used in the construction of biomolecular electronic devices.

SUMMARY OF THE INVENTION

The present invention is directed to methods of forming molecular devices that are capable of converting light energy into chemical energy. The devices convert the light energy to chemical energy through the use of Photosystem I ("PSI") reaction centers. More specifically, the present invention is directed to methods of chemically modifying the surface of a substrate such that PSI reaction centers may be oriented in a preselected orientation. The methods orient and immobilize PSI reaction centers onto a substrate without denaturation of the PSI.

The methods of the present invention orient and immobilize the PSI reaction centers by chemically modifying the surface of the substrate and then immersing the chemically-modified substrate within a PSI solution such that the PSI reaction centers are immobilized on the surface of the substrate. The chemical compound may be selected to modify the substrate such that the PSI reaction centers are oriented in a preselected orientation. Preferably, the chemical compound is a sulfur-organic compound. Depending on the chemical compound used, the PSI reaction centers may be immobilized and oriented in a direction parallel to the surface of the substrate, perpendicular to the surface in the "up" position, or perpendicular to the surface in the "down" position. Each of these directions provides different characteristics to the device.

Accordingly it is an object of the present invention to provide methods useful for forming molecular devices.

It is another object of the present invention to provide methods of selectively immobilizing Photosystem I reaction centers onto a substrate without denaturation of the PSI.

It is still another object of the present invention to provide methods of selectively immobilizing Photosystem I reaction centers onto a substrate in a preselected orientation.

These and other objects, features and advantages of the present invention will become apparent after a review of the following detailed description of the disclosed embodiments and the appended claims.

BRIEF DESCRIPTION OF THE DRAWINGS

FIGS. 1(*a*) and 1(*b*) show an orientation of PSI reaction centers in a direction parallel to the surface of the substrate and the corresponding current-voltage (I-V) curve.

FIGS. 2(*a*) and 2(*b*) show an orientation of PSI reaction centers in a direction perpendicular to the surface in the "up" position and the corresponding I-V curve.

FIGS. 3(*a*) and 3(*b*) show an orientation of PSI reaction centers in a direction perpendicular to the surface in the "down" position and the corresponding I-V curve.

DETAILED DESCRIPTION

The conversion of light energy into chemical energy is a well known photosynthetic occurrence that green plants and photosynthetic bacteria carry out. Photon capture and conversion of light energy into chemical energy take place in pigment-protein complexes known as Photosystem I ("PSI") and Photosystem II ("PSII") reaction centers. Current technology is attempting to replicate this reaction as an electrical component in a variety of nanofabricated biomolecular devices. However, based upon the orientation of the reaction centers, differently anchored orientations provide different electronic properties. Therefore, methods are needed to control the functional orientation of the PSI on the surface of a substrate.

The present invention is directed to methods of orienting PSI reaction centers on a substrate. The methods include the chemical modification of a surface of the substrate such that the surface of the substrate is capable of immobilizing a PSI reaction center in a preselected orientation. Then, a solution containing the PSI reaction centers is added and the PSI are oriented in the preselected orientation. The preselected orientation may be parallel to the surface of the substrate, perpendicular to the surface in the "up" position, or perpendicular to the surface in the "down" position. As discussed below, the determination of the preselected orientation should be based upon the desired use of the substrate.

Any compound capable of chemically-modifying a substrate such that PSI reaction centers will be oriented on the substrate may be used in the present invention. However, in general, it has been found that sulfur-organic compounds provide effective compounds for modifying substrates. The sulfur in the sulfur-organic compound binds to the substrate and the organic portion determines the orientation of the PSI reaction centers. Some compounds 20 will cause the PSI 10 to be oriented in a direction parallel to the surface of the substrate 30 [FIG. 1(a)]; others will cause the PSI 10 to be oriented in a direction perpendicular to the surface in the "up" position [(FIG. 2(a)]; while still others will cause the PSI 10 to be oriented in a direction perpendicular to the surface in the "down" position [FIG. 3(a)]. As can be seen in FIGS. 1(b), 2(b) and 3(b), the different orientations produce different current-voltage curves and, therefore, different electrical properties. Parallel orientations result in semiconductor-like current-voltage ("I-V") curves, while up or down orientations result in diode-like I-V curves.

Sulfur-organic compounds useful in the present invention include, but are not limited to, mercaptoacetic acid, 2-mercaptoethanol and 2-dimethylaminoethanethiol. However, as discussed above, any sulfur-organic compound may be used as long as the compound is capable of chemically-modifying a substrate such that PSI reaction centers will be immobilized in a preselected orientation.

The substrate used is dependent upon its ability to be chemically modified and its usefulness as an electronic component. In general, any flat substrate may be used. Examples of substrates useful in the present invention include, but are not limited to, metals, metal-coated substrates, silicon, metal silicide, and tinoxide. Preferably, the substrate comprises a metal-coated substrate. In general, any metal may be used either alone or as a coating on a flat substrate. Examples of metals useful in the present invention include, but are not limited to, gold, platinum, silver and tin. Preferably, the metal is gold and the substrate comprises a gold coating on a mica substrate.

The methods of the present invention are designed to orient PSI reaction centers on a substrate in a preselected orientation. Since different orientations produce different electrical properties, it may be desired to have a majority of the PSI oriented in a particular orientation. Some of the compounds useful in the present invention are able to ensure that a significant amount of the PSIs, e.g. at least 60 percent, are oriented in a particular direction. For example, while 2-dimethylaminoethanethiol produces an approximately equal distribution of the PSIs, mercaptoacetic acid may be used to achieve a predominantly parallel orientation while 2-mercaptoethanol may be used to achieve a predominantly "up" orientation.

The methods of the present invention first begin with the chemical modification of the substrate to form a substrate that is capable of immobilizing PSI reaction centers in a preselected orientation. To chemically modify the substrate, the substrate is contacted with the compound. Preferably, the substrate is immersed in a solution containing the chemical compound to form a surface on the substrate that is capable of immobilizing PSI reaction centers. The orientation of the PSIs is determined by the chemical compound used. The substrate should remain in contact with the chemical compound for a time sufficient to effectively modify the surface, usually from about 15 to about 60 seconds. While immersion is the preferred technique, any technique capable of ensuring sufficient contact between the chemical compound and the substrate may be used.

Next, the chemically-modified substrate is preferably rinsed and dried before covering the substrate with the PSI reaction centers. Preferably, to apply the PSI reaction centers to the chemically-modified substrate, the substrate is immersed in a PSI solution for a given period of time. The longer the substrate is immersed, the greater the PSI coverage on the substrate. Since greater PSI coverage is usually preferred, longer immersion times, e.g. about 12 hours, are preferred. However, for less PSI coverage, a shorter immersion time may be used as well. After removal from the PSI solution, the newly formed molecular device may be rinsed and dried and then stored or used as an electrical component.

The present invention is further illustrated by the following examples, which are not to be construed in any way as imposing limitations upon the scope thereof. On the contrary, it is to be clearly understood that resort may be had to various other embodiments, modifications, and equivalents thereof which, after reading the description herein, may suggest themselves to those skilled in the art without departing from the spirit of the present invention and/or the scope of the appended claims.

EXAMPLES

Examples 1–3

Examples 1–3 are directed to two-dimensional vectorial arrays on flat, derivatized gold surfaces. The gold surfaces were chemically modified using three different sulfur-organic compounds to control the nature and extent of orientation.

Molecular self-assembly was used both to anchor two-dimensional arrays of PSI to an electrode (an Au{111} substrate) and to obtain a controllable orientation. The arrays of PSI were observed using tapping-mode atomic force microscopy (AFM) and scanning tunneling microscopy (STM) in an environment of controlled humidity. Scanning tunneling spectroscopy STS was then used to examine the electronic properties and orientation of each PSI anchored on the gold electrode.

Thylakoid membranes were isolated from spinach leaves using the procedure described in *Methods Enzymology*, S. G. Reeves and D. O. Hall, 69, 85 (1980). PSI reaction centers, together with their antenna complexes containing about 40 chlorophylls per photoactive P700 (PSI-40), were isolated from the thylakoid membranes by detergent (Triton X-100, J. T. Baker, Inc., Phillipsburg, N.J.) solubilization, centrifugation and hydroxylapatite column purification. PSI was eluted in a buffer solution (0.2M phosphate, pH 7.0. containing 0.05% Triton X-100). P700 concentration was determined using the chemically induced absorbence change at 697 nm and a differential extinction coefficient of 64 $M^{-1}$ $cm^{-1}$. Chlorophyll content was determined in 90% acetone extract.

The gold electrode (Au{111}) was epitaxially grown by evaporation of 120 nm of gold onto freshly cleaved mica heated to a temperature of 300–400° C. in high vacuum. The gold substrates were each immersed in a 10 mM solution of mercaptoacetic acid ($HSCH_2COOH$), 2-dimethylaminoethanethiol (($CH_3$)$_2NCH_2CH_2SH$), or 2-mercaptoethanol ($HSCH_2CH_2OH$) for 30 seconds to form a negative, positive, or hydrophilic surface, respectively. After being rinsed thoroughly with nanopure distilled water and dried with ultrapure nitrogen (99.995%), the gold substrate was incubated in a PSI solution for 12 hours in a refrigerator. In order to obtain less than one monolayer of PSI coverage, gold electrodes with mercaptoacetic acid or 2-mercaptoethanol surface modification were incubated in PSI solutions for 4 hours. The same cleaning and drying processes were applied after the samples had been taken out of the PSI solution.

For comparison, control samples were taken at each major step; (i) after gold evaporation, (ii) after surface modification and the cleaning/drying processes, and (iii) after incubation in a buffer solution without PSI. These control samples were examined by AFM, STM, and STS, along with the regular samples under the same experimental conditions. The control samples demonstrated that the measured phenomena, discussed hereafter, were caused by the presence of oriented reaction centers and were not artifacts of the experimental arrangement. The AFM/STM images and STS curves were recorded with a Nanoscope IIIa (Digital Instruments, Santa Barbara, CA) in an ultrapure helium (99.996%) atmosphere under controlled humidity at room temperature. (The AFM was operated at a relative humidity of less than 1%; the STM was operated at a relative humidity between 15% and 20%.) Cantilever tips made from $n^+$ silicon were used for tapping-mode AFM imaging, and mechanically cut Pt/Ir tips were used for both STM and STS studies. The STM images were taken at a –3.5 V bias with a set-point current of 200 pA. For the STS studies, the current-voltage (I-V) data were obtained with a sample period of 0.2 ms per point for 256 data points by sweeping the substrate potential between –1.0 and 1.0 V. (The STM tip was held at ground potential.) Each I-V curve represents an average of 50 scans. The absolute STS tip-sample distance is not known, but all data (with or without PSI) were taken at a distance where a –500 mV sample bias yielded a 200 pA tunneling current.

The PSI percentage coverage on the self-assembled gold electrodes was calculated using NIH IMAGE v.1.57 software. These samples were incubated in the PSI solution for 12 hours. The experiment for PSI percentage coverage was repeated five times; each time a total area of 1×1 $\mu$m was randomly chosen and imaged by AFM. It was found that (65±7)% of the area was covered with PSI when the gold electrode was treated with mercaptoacetic acid. This chemical treatment covers the gold surface with negatively charged end groups that attract and orient PSI. Previous studies have shown that the polar regions (both ends) of the PSI are positively charged. These regions serve as docking sites for ferredoxin and plastocyanin, the natural electron acceptor and donor, respectively, for PSI. The result is consistent with the previous findings. On the other hand, very little PSI coverage was found, i.e., (5.0±0.7)%, on 2-dimethylaminoethanethiol-treated gold electrodes. This treatment is designed to terminate the surface with positively charged end groups. A positively charged surface does not attract PSI very well. When the gold electrode was treated with 2-mercaptoethanol, (70±11)% of the area was covered with PSI. This chemical treatment is designed to terminate the surface with end groups that form hydrogen bonds with PSI.

The experimental protocol for the determination of PSI orientation was to cut a Pt/Ir tip for each new sample and check it on a fresh gold surface. If the tip produced good resolution of the gold surface, it was tested further with the STS I-V scan. If the I-V scan showed a good gold characteristic curve, the tip was then used to image the sample with PSI. These samples were incubated in the PSI solution for 4 hours. An area of 200×200 nm was imaged, and each PSI was analyzed with an I-V curve measurement. Between I-V curves on each PSI, the tip was moved to a clean surface on the same sample and the I-V curve was checked. This process ensured that the tip remained clean after each approach to a single PSI since the tip was closer to the substrate when taking the I-V curve of a PSI (bias of –500 mV) than when imaging the PSI (bias of –3.5 V). The experiment was repeated three times on different samples, with a total of 100 PSI reaction centers being measured on each self-assembly.

The characteristics of the I-V curve can be used to determine the PSI orientation. If a PSI is oriented with its electron transport vector parallel to the electrode surface, a semiconductor-like I-V curve with a band gap of –1.8 eV (corresponding to the first excited singlet state of chlorophyll) can be observed [FIG. 1(b)]. On the other hand, if a PSI is anchored with its electron transport vector perpendicular to the gold surface, a diode-like (current-rectification) I-V curve can be observed [FIGS. 2(b) and 3(b)]. In the present invention, the PSI reaction center has an oxidizing potential of about +0.4 V at the electron donor side and a reducing potential of about –0.7 V at the acceptor side. The asymmetry of the I-V curve can be due to either a difference in electronic energy (in analogy with a solid-state pn junction) or a difference in the tunneling distance for each end. In either case, his strong asymmetric property can be used to determine the anchored PSI orientation.

TABLE 1

| Surface treatment of gold | Up (%) | Parallel (%) | Down (%) |
|---|---|---|---|
| Mercaptoacetic Acid | 9.0 | 83.1 | 7.9 |
| 2-Dimethylaminoethanethiol | 31.2 | 32.7 | 36.1 |
| 2-Mercaptoethanol | 70.1 | 28.4 | 1.5 |

The orientations of PSI on various derivatized gold surfaces are summarized in Table 1. It was found that, when gold electrodes were treated with mercaptoacetic acid, 83.1% of the PSI were anchored parallel to the surface, 9.0% were "up," and 7.9% were "down." For gold treated with 2-dimethylarninoethanethiol, 31.2% of the PSI were up, 32.7% were parallel to the surface and 36.1% were anchored in a down position. For the 2-mercaptoethanol treatment, 70.1% of the PSI were anchored up, 28.4% were parallel, and 1.5% were anchored in a down position. Each experiment was repeated three times. The percentage error for each experiment, which was about 10%, may have been caused by defects on the gold or in the assembly process.

These experiments are the first demonstration that PSI can be selectively oriented by chemical modification of a surface. Mercaptoacetic acid can be used to anchor PSI parallel to the surface. On the other hand 2-mercaptoethanol can be used to orient PSI onto the gold electrode in an up position. Differently anchored orientations provide different electronic properties. These results provide a rational strategy for the controlled functional orientation of the PSI molecules on a two-dimensional surface.

What is claimed is:

1. A method of making a molecular device comprising:

chemically modifying a surface of a substrate such that the surface of the substrate is capable of immobilizing a Photosystem I reaction center in a preselected orientation; and applying a solution containing Photosystem I reaction centers to the chemically-modified substrate to orient the Photosystem I reaction centers in the preselected orientation, wherein the surface of the substrate is chemically modified by immersing the substrate in a solution containing a sulfur-organic compound.

2. The method of claim 1, wherein the substrate is selected from a metal, a metal-coated substrate, silicon, metal silicide, or tinoxide.

3. The method of claim 2, wherein the substrate comprises a gold-coated substrate.

4. The method of claim 1, wherein at least 60 percent of the Photosystem I reaction centers are oriented in the preselected orientation.

5. The method of claim 1, wherein the sulfur-organic compound is selected from mercaptoacetic acid, 2-mercaptoethanol, or 2-dimethylaminoethanethiol.

6. The method of claim 1, wherein the sulfur-organic compound is mercaptoacetic acid and the preselected orientation is parallel to the surface of the substrate.

7. The method of claim 6, wherein at least 80 percent of the Photosystem I reaction centers are oriented parallel to the surface of the substrate.

8. The method of claim 1, wherein the sulfur-organic compound is 2-mercaptoethanol and the preselected orientation is perpendicular to the surface of the substrate in the "up" position.

9. The method of claim 8, wherein at least 70 percent of the Photosystem I reaction centers are oriented perpendicular to the surface of the substrate in the "up" position.

10. A molecular electronic device comprising:

a substrate having a chemically-modified surface; and a plurality of Photosystem I reaction centers immobilized on the chemically-modified substrate, wherein the Photosystem I reaction centers are oriented on the surface of the substrate in a preselected orientation, wherein the surface of the substrate has been chemically modified by a sulfur-organic compound.

11. The device of claim 10, wherein the substrate is selected from a metal, a metal-coated substrate, silicon, metal silicide, or tinoxide.

12. The device of claim 11, wherein the substrate comprises a gold-coated substrate.

13. The device of claim 10, wherein at least 60 percent of the Photosystem I reaction centers are oriented in the preselected orientation.

14. The device of claim 9, wherein the sulfur-organic compound is selected from mercaptoacetic acid, 2-mercaptoethanol, or 2-dimethylaminoethanethiol.

15. The device of claim 9, wherein the sulfur-organic compound is mercaptoacetic acid and the preselected orientation is parallel to the surface of the substrate.

16. The device of claim 15, wherein at least 80 percent of the Photosystem I reaction centers are oriented parallel to the surface of the substrate.

17. The device of claim 9, wherein the sulfur-organic compound is 2-mercaptoethanol and the preselected orientation is perpendicular to the surface of the substrate in the "up" position.

18. The device of claim 17, wherein at least 70 percent of the Photosystem I reaction centers are oriented perpendicular to the surface of the substrate in the "up" position.

* * * * *